(12) United States Patent
Shimomura et al.

(10) Patent No.: US 8,547,670 B2
(45) Date of Patent: Oct. 1, 2013

(54) INTEGRATED CIRCUIT

(75) Inventors: Hiroshi Shimomura, Fukuoka-ken (JP);
Masaru Numano, Saitama-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 42 days.

(21) Appl. No.: 13/397,910

(22) Filed: Feb. 16, 2012

(65) Prior Publication Data
US 2012/0212868 A1 Aug. 23, 2012

(30) Foreign Application Priority Data

Feb. 21, 2011 (JP) ................................. 2011-034442

(51) Int. Cl.
*H02H 9/00* (2006.01)

(52) U.S. Cl.
USPC ........................................................ 361/56

(58) Field of Classification Search
USPC ........................................................ 361/56
See application file for complete search history.

(56) References Cited

U.S. PATENT DOCUMENTS

| | | | | |
|---|---|---|---|---|
| 5,838,146 | A * | 11/1998 | Singer | 323/270 |
| 6,690,561 | B2 * | 2/2004 | Hung et al. | 361/111 |
| 6,906,573 | B2 | 6/2005 | Numano | |
| 7,768,753 | B2 * | 8/2010 | Fankhauser et al. | 361/56 |
| 2003/0043523 | A1 * | 3/2003 | Hung et al. | 361/111 |
| 2004/0217425 | A1 * | 11/2004 | Brodsky et al. | 257/360 |
| 2005/0111150 | A1 * | 5/2005 | Jang et al. | 361/56 |
| 2005/0173727 | A1 * | 8/2005 | Manna et al. | 257/173 |
| 2005/0180073 | A1 * | 8/2005 | Armer et al. | 361/56 |
| 2007/0268638 | A1 * | 11/2007 | Fankhauser et al. | 361/56 |
| 2008/0080108 | A1 * | 4/2008 | Lin et al. | 361/56 |
| 2008/0239599 | A1 * | 10/2008 | Yizraeli et al. | 361/56 |
| 2008/0316659 | A1 * | 12/2008 | Oguzman et al. | 361/56 |
| 2009/0213507 | A1 * | 8/2009 | Chen et al. | 361/56 |

FOREIGN PATENT DOCUMENTS

| | | |
|---|---|---|
| JP | 2004-222119 | 8/2004 |
| JP | 2008-218825 | 9/2008 |

\* cited by examiner

*Primary Examiner* — Ronald W Leja
(74) *Attorney, Agent, or Firm* — Oblon, Spivak, McClelland, Maier & Neustadt, L.L.P.

(57) ABSTRACT

According to one embodiment, an integrated circuit includes a power supply terminal, an output terminal, a high side output transistor including a first electrode connected to the power supply terminal, a second electrode connected to the output terminal, and a control electrode, a transistor which is connected between the control electrode and the second electrode of the high side output transistor and which short-circuits the control electrode and the second electrode in an on state, a trigger circuit connected between the power supply terminal and the control electrode of the transistor, and an Electro Static Discharge (ESD) protection circuit connected between the power supply terminal and the output terminal. When a voltage larger than a maximum rating voltage is applied to the power supply terminal, the trigger circuit operates, the transistor turns on, the high side output transistor turns off, and the ESD protection circuit operates.

16 Claims, 5 Drawing Sheets

INTEGRATED CIRCUIT

CROSS-REFERENCE TO RELATED APPLICATIONS

This application is based upon and claims the benefit of priority from the prior Japanese Patent Application No. 2011-034442, filed on Feb. 21, 2011; the entire contents of which are incorporated herein by reference.

FIELD

Embodiments described herein relate generally to an integrated circuit.

BACKGROUND

In an integrated circuit having a protection circuit for absorbing or removing electric charges at the time of applying an Electro Static Discharge (ESD), it is difficult to operate with high reliability the protection circuit in order to place priority on normal operation. There are some cases in which elements to be protected fundamentally operate at the time of applying an ESD and in consequence of it, the operation of the protection circuit stops.

DETAILED DESCRIPTION

Figure 1:
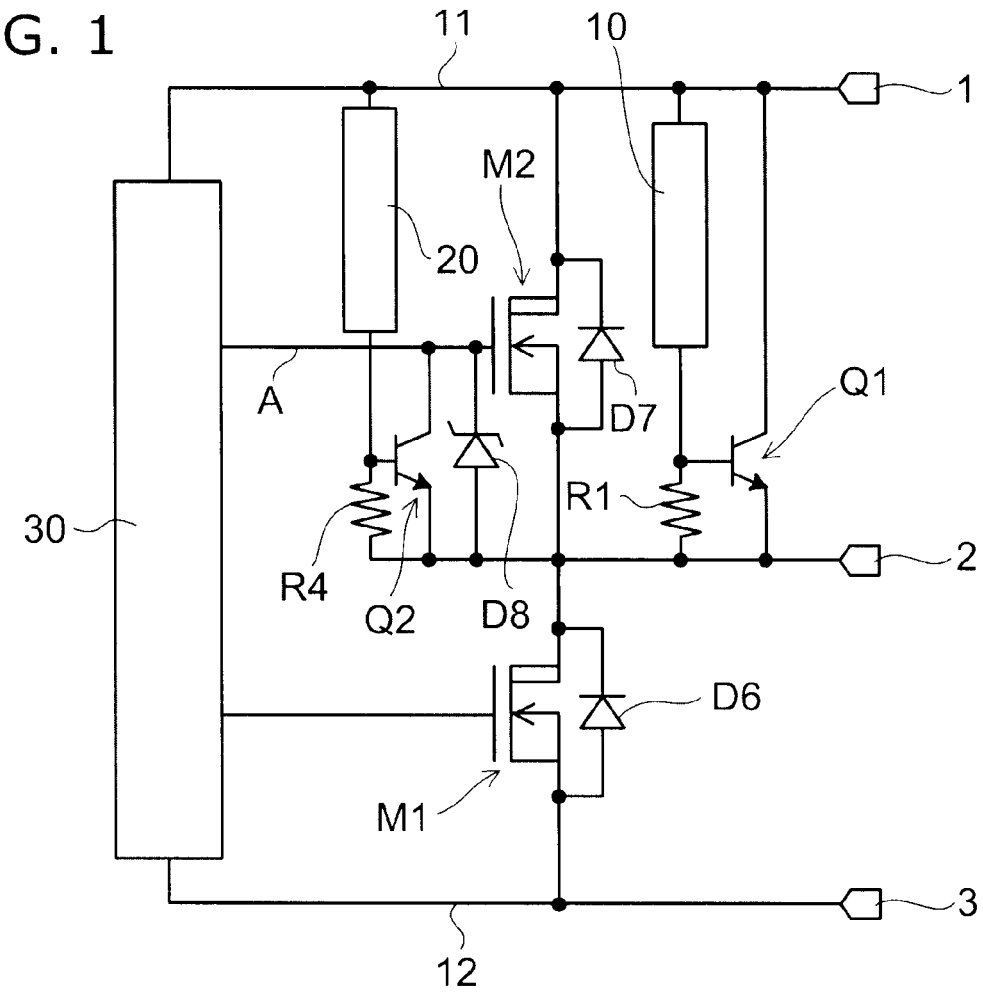
FIG. 1 is a circuit diagram of an integrated circuit according to a first embodiment.

According to one embodiment, an integrated circuit includes a power supply terminal, an output terminal, a high side output transistor including a first electrode connected to the power supply terminal, a second electrode connected to the output terminal, and a control electrode, a transistor which is connected between the control electrode and the second electrode of the high side output transistor and which short-circuits the control electrode and the second electrode in an on state, a trigger circuit connected between the power supply terminal and the control electrode of the transistor, and an Electro Static Discharge (ESD) protection circuit connected between the power supply terminal and the output terminal. When a voltage larger than a maximum rating voltage is applied to the power supply terminal, the trigger circuit operates, the transistor turns on, the high side output transistor turns off, and the ESD protection circuit operates.

Embodiments will now be described with reference to the accompanying drawings. Same reference numerals are added to the same elements in each of the drawings.

First Embodiment

FIG. 1 is a circuit diagram of an integrated circuit according to a first embodiment.

The integrated circuit of the embodiment has a so-called totem pole structure in which a high side output transistor M2 and a low side output transistor M1 with the same conductivity type are connected in series.

The high side output transistor M2 and the low side output transistor M1 are Field Effect Transistor (FET) having, for example, an n-type double diffusion MOS (DMOS) structure.

Respective elements shown in FIG. 1 are integrated on a single semiconductor substrate or one chip. The integrated circuit of the embodiment has three terminals 1 to 3 connectable to the outside. A power supply terminal (also represented as a VCC terminal) 1 is connected to an external power supply. An output terminal (also represented as a VO terminal) 2 is connected to an object to be driven (for example, a power device). A ground terminal (also represented as a GND terminal) 3 is grounded.

The VCC terminal 1 is connected to the power-supply line 11, and the GND terminal 3 is connected to the ground line 12. An internal circuit 30 is connected between the power-supply line 11 and the ground line 12. The internal circuit 30 includes an internal electric power source circuit, an input circuit, a signal-processing circuit, etc.

The high side output transistor M2 is connected between the VCC terminal 1 and the VO terminal 2. A drain which is a first electrode of the high side output transistor M2 is connected to the power-supply line 11. A source which is a second electrode of the high side output transistor M2 is connected to the VO terminal 2. A gate which is a control electrode of the high side output transistor M2 is connected to the internal circuit 30.

The low side output transistor M1 is connected between the VO terminal 2 and the GND terminal 3. A drain which is a first electrode of the low side output transistor M1 is connected to the source of the VO terminal 2 and the high side output transistor M2. A source which is a second electrode of the low side output transistor M1 is connected to the ground line 12. A gate which is a control electrode of the low side output transistor M1 is connected to the internal circuit 30.

A diode D7 represents a parasitic diode between the source and the drain of the high side output transistor M2. A diode D6 represents a parasitic diode between the source and the drain of the low side output transistor M1.

An ESD protection circuit is connected between the VCC terminal 1 and the VO terminal 2. The ESD protection circuit is connected in parallel to the high side output transistor M2. The ESD protection circuit includes a bipolar transistor Q1, a trigger circuit 10, and a resistance R1.

The bipolar transistor Q1 is, for example, a npn-type bipolar transistor. A collector of the bipolar transistor Q1 is connected to the power-supply line 11. An emitter of the bipolar transistor Q1 is connected to the VO terminal 2. A base which is a control electrode of the bipolar transistor Q1 is connected to the trigger circuit 10.

The trigger circuit 10 is connected between the power-supply line 11 and the base of the bipolar transistor Q1. If the electric potential difference between the VCC terminal 1 and the VO terminal 2 becomes larger than a maximum rating voltage at the time of normal operation, the trigger circuit 10 operates and supplies current to the base of the bipolar transistor Q1.

As the trigger circuit 10, for example, a plurality of Zener diodes connected in series can be used. These Zener diodes are connected in series between the power-supply line 11 and the base of the bipolar transistor Q1 in a forward direction going from the base of the bipolar transistor Q1 toward the power-supply line 11.

The resistance R1 is connected between the base of the bipolar transistor Q1 and the VO terminal 2.

A bipolar transistor Q2 is connected between the gate and the source of the high side output transistor M2. Furthermore, a Zener diode D8 is connected between the gate and the source of the high side output transistor M2. An anode of the Zener diode D8 is connected to the source of the high side output transistor M2, and a cathode of the Zener diode D8 is connected to the gate of the high side output transistor M2.

The bipolar transistor Q2 is, for example, a npn-type bipolar transistor. A collector of the bipolar transistor Q2 is connected to the gate of the high side output transistor M2. An emitter of the bipolar transistor Q2 is connected to the source of the high side output transistor M2.

If the bipolar transistor Q2 turns on, the gate and the source of the high side output transistor M2 is short-circuited, and the high side output transistor M2 turns off.

A base which is a control electrode of the bipolar transistor Q2 is connected to a trigger circuit 20. The trigger circuit 20 is connected between the power-supply line 11 and the base of the bipolar transistor Q2. If the electric potential difference between the VCC terminal 1 and the VO terminal 2 becomes larger than the maximum rating voltage at the time of normal operation, the trigger circuit 20 operates and supplies current to the base of the bipolar transistor Q2.

As the trigger circuit 20, for example, a plurality of Zener diodes connected in series can be used. These Zener diodes are connected in series between the power-supply line 11 and the base of the bipolar transistor Q2 in a forward direction going from the base of the bipolar transistor Q2 toward the power-supply line 11.

The resistance R4 is connected between the base of the bipolar transistor Q2 and the VO terminal 2.

Next, the operation of the integrated circuit of the embodiment will be described.

At the time of normal operation, by an external power supply voltage applied to the VCC terminal 1, the internal circuit 30 is operated and drives the gate of the high side output transistor M2 and the gate of the low side output transistor M1. The high side output transistor M2 and the low side output transistor M1 alternately repeat turning on/off. Because of this, a desired voltage is output to the VO terminal 2.

Next, the operation of the integrated circuit at the time of applying an ESD to the circuit will be described.

When the VO terminal 2 is at a ground electric potential, if a positive voltage (ESD voltage) greater than the maximum rating voltage at the time of normal operation is applied to the VCC terminal 1, the electric potential of the power-supply line 11 increases. By this, the trigger circuit 20 is operated and current is supplied to the base of the bipolar transistor Q2 from the power-supply line 11.

By this, the bipolar transistor Q2 turns on and is short-circuited between the gate and the source of the high side output transistor M2. Because of this, the high side output transistor M2 is turned off.

The trigger circuit 10 of the ESD protection circuit is operated at the same time when the high side output transistor M2 is turned off or after a short time interval. By this, current is supplied to the base of the bipolar transistor Q1 from the power-supply line 11, and the bipolar transistor Q1 turns on.

When the bipolar transistor Q1 turns on, the Q1 consumes ESD electric charges applied to the VCC terminal 1. The high side output transistor M2 in an off state does not consume the ESD electric charges, and thus breakage of the high side output transistor M2 can be prevented.

Figure 3A:
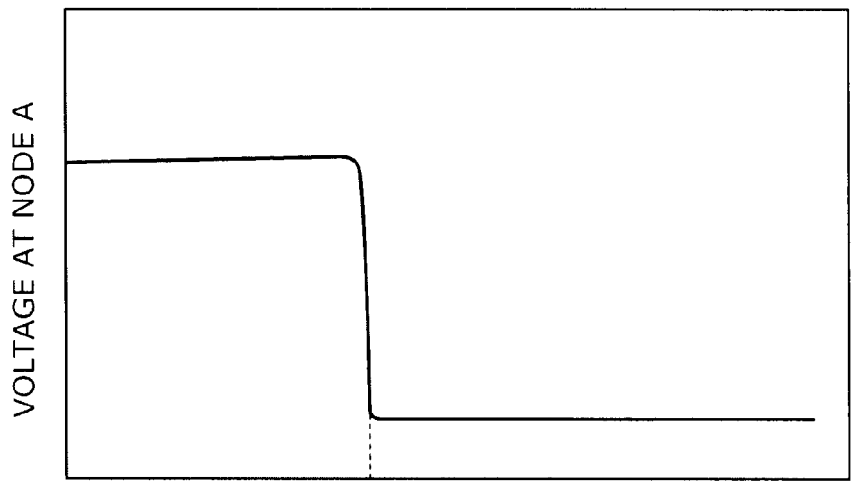
FIG. 3A shows time change of an electric potential at node A of the circuit in FIG. 1.

Here, FIG. 3A shows time change of an electric potential at node A of the circuit in FIG. 1 (gate electric potential of the high side output transistor M2).

Figure 3B:
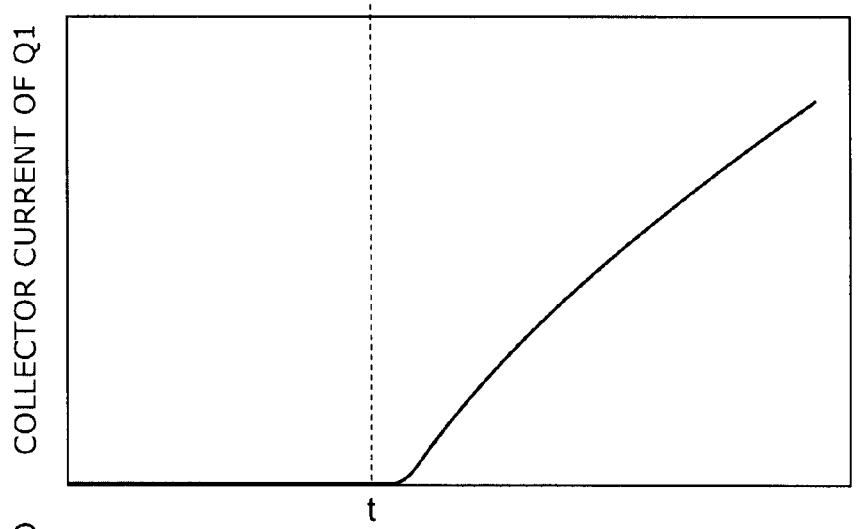
FIG. 3B shows time change of a collector current of the bipolar transistor Q1.

FIG. 3B shows time change of a collector current of the bipolar transistor Q1.

Figure 3C:
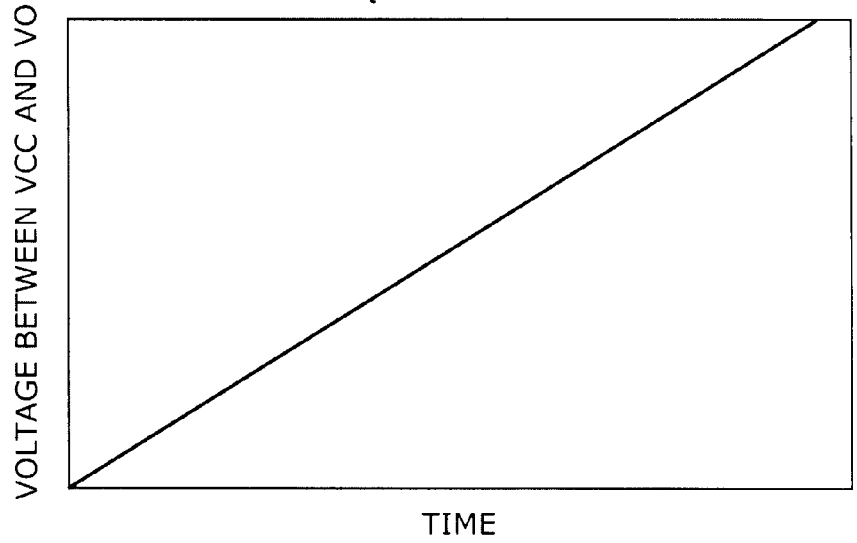
FIG. 3C shows time change of a voltage between the VCC terminal 1 and the VO terminal 2.

FIG. 3C shows time change of a voltage between the VCC terminal 1 and the VO terminal 2.

If the electric potential of the power-supply line 11 is increased by applying an ESD, the trigger circuit 20 operates and the bipolar transistor Q2 turns on, as shown in FIG. 3A, the electric potential at node A decreases. Because of this, the high side output transistor M2 turns off.

Then, if the electric potential at node A decreases at Time t, as shown in FIG. 3B, the collector current of the bipolar transistor Q1 of the ESD protection circuit flows. That is, after the high side output transistor M2 turns off, the bipolar transistor Q1 of the ESD protection circuit turns on, and the ESD charges are consumed by the bipolar transistor Q1.

Therefore, stable operation of the ESD protection circuit can be achieved without operating the high side output transistor M2 which is an object to be protected, at the time of applying an ESD.

Second Embodiment

Figure 4:
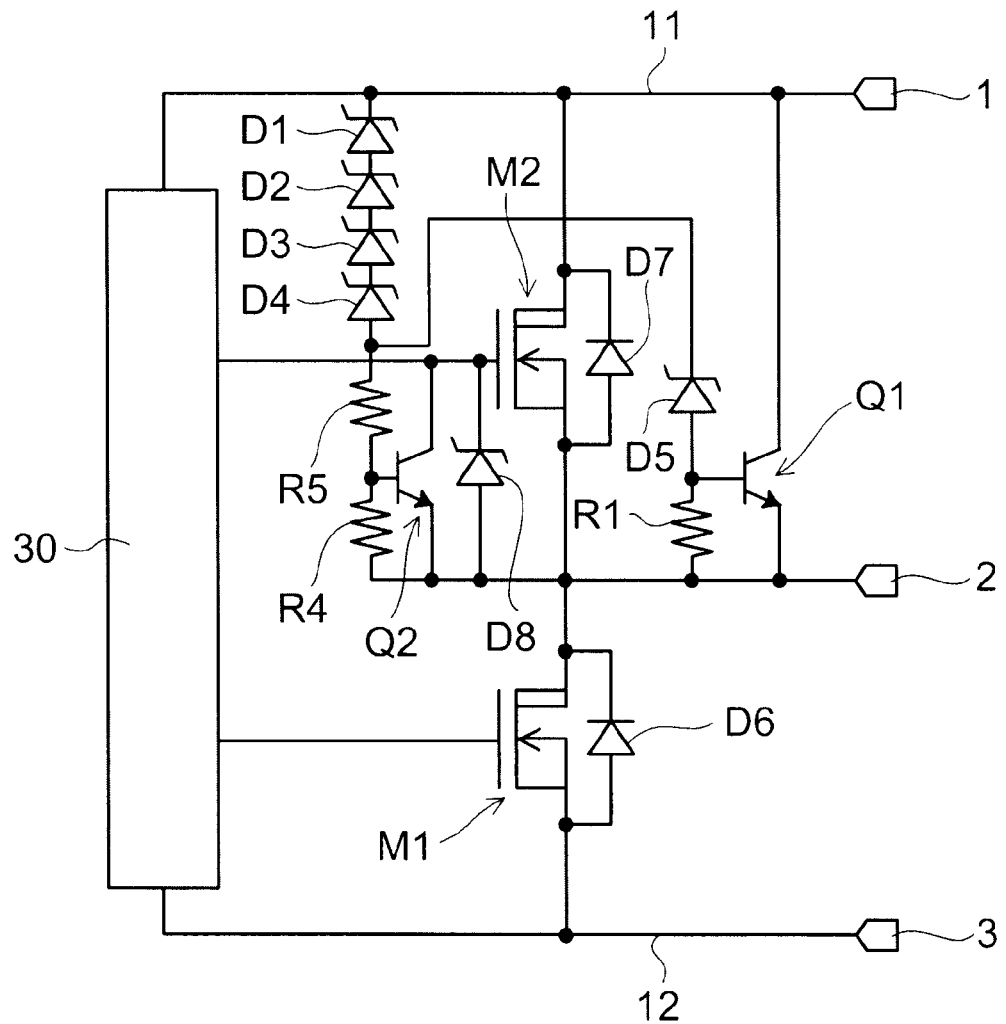
FIG. 4 is a circuit diagram of the integrated circuit of a second embodiment.

FIG. 4 is a circuit diagram of the integrated circuit of a second embodiment. In addition, the same elements as the elements of the circuit according to the first embodiment shown in FIG. 1 are designated by the same reference numerals.

In the embodiment, for the trigger circuit 10 shown in FIG. 1, Zener diodes D1 to D5 are used. Further, for the trigger circuit 20 shown in FIG. 1, Zener diodes D1 to D4 and a resistance R5 are used.

Zener diodes D1 to D4 are commonly used in both of the trigger circuit 10 and the trigger circuit 20. Because of this, chip area reduction can be achieved. Although four Zener diodes D1 to D4 are shown in the figure, the number of Zener diodes is arbitrary.

The Zener diodes D1 to D4 and the resistance R5 are connected in series between the power-supply line 11 and the base of the bipolar transistor Q2. The forward direction of the Zener diodes D1 to D4 is set to a direction going from the base of the bipolar transistor Q2 toward the power-supply line 11. The resistance R5 is connected between the anode of the Zener diode D4, and the base of the bipolar transistor Q2.

The Zener diode D5 is connected between the anode of the Zener diode D4 and the base of the bipolar transistor Q1. The cathode of the Zener diode D5 is connected to the anode of the Zener diode D4, and the anode of the Zener diode D5 is connected to the resistance R1 and the base of the bipolar transistor Q1.

The resistance R5 is connected to the base of the bipolar transistor Q2, and the Zener diode D5 is connected to the base of the bipolar transistor Q1. Because of this, a time lag between the timing when the bipolar transistor Q2 turns on and the timing when the bipolar transistor Q1 turns on is generated.

That is, if the Zener diodes D1 to D4 are broken down by applying an ESD to the VCC terminal 1, the bipolar transistor Q2 turns on in advance and then, the bipolar transistor Q1 turns on. Because of this, after the high side output transistor M2 is surely turned off, the bipolar transistor Q1 can be caused to consume the ESD charges.

Alternatively, a Zener diode may be used instead of the resistance R5. The bipolar transistor Q1 may turn on at the same time when the bipolar transistor Q2 turns on.

Third Embodiment

Figure 5:
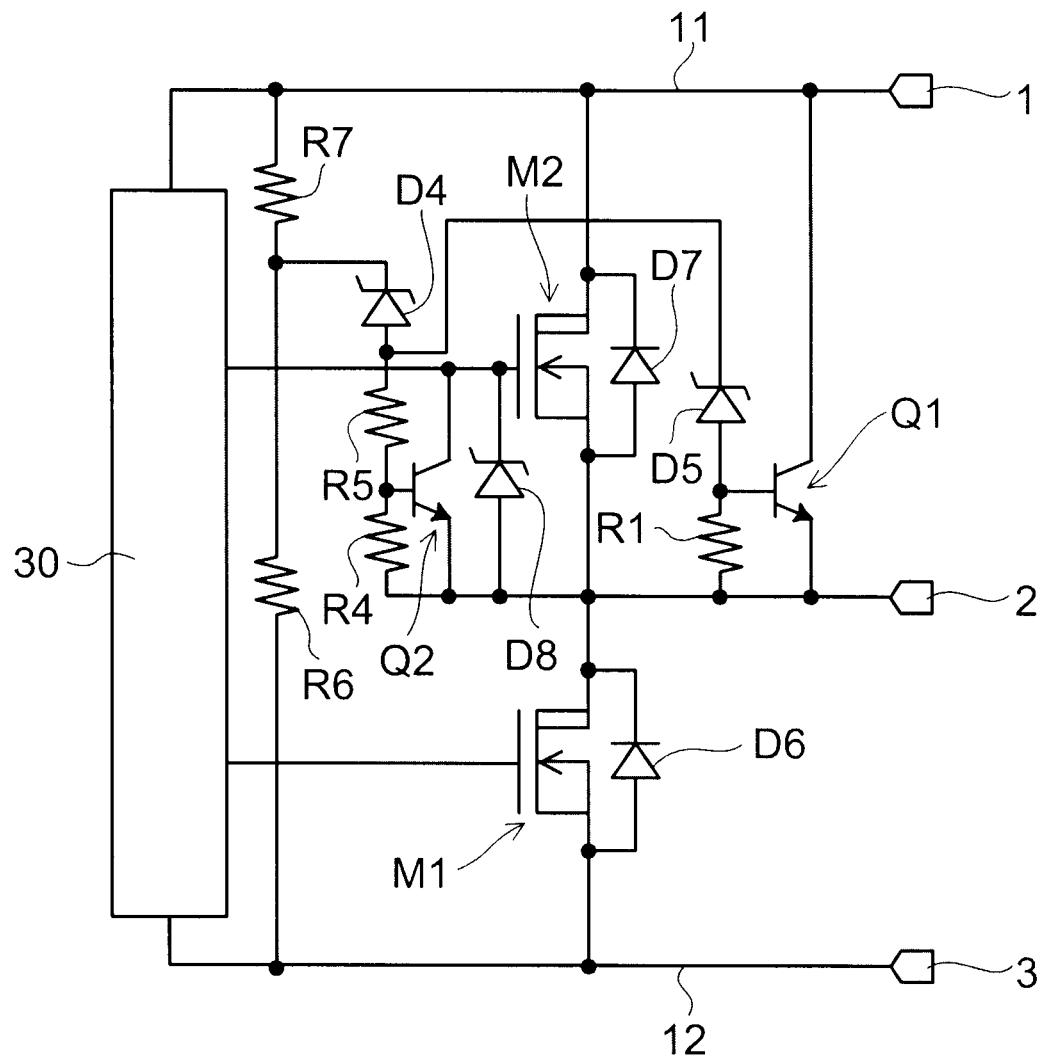
FIG. 5 is a circuit diagram of an integrated circuit according to a third embodiment.

FIG. 5 is a circuit diagram of an integrated circuit according to a third embodiment. The same elements as the elements of the circuit according to the above-described embodiments are designated by the same reference numerals.

In the embodiment, resistance R7 and resistance R6 are used instead of the Zener diodes D1 to D3 in FIG. 4.

The resistance 6 and the resistance 7 are connected in series between the power-supply line 11 and the ground line 12. The cathode of the Zener diode D4 is connected to a connection node between the resistance 6 and the resistance 7.

In each of the embodiments described above, the trigger circuit 20 does not operate at the time of the normal operation in which voltage applied to the VCC terminal 1 is not more than the maximum rating voltage. For example, in an embodiment in which a Zener diode is used as the trigger circuit 20, the Zener diode does not break down at the time of normal operation. Furthermore, the resistance R4 is connected between the base and emitter of the bipolar transistor Q2. Therefore, the bipolar transistor Q2 does not turn on at the time of normal operation.

For example, in the third embodiment shown in FIG. 5, there are some cases in which a reverse direction voltage close to the power supply voltage is applied to the Zener diode D4 at the time of normal operation, and thus the Zener diode D4 is required to have a breakdown voltage which withstands the voltage. When the breakdown voltage of the Zener diode D4 is insufficient, for example, an npn-type bipolar transistor etc. in which the emitter and the base are short-circuited can be used.

Furthermore, the trigger circuit 10 of the ESD protection circuit does not operate at the time of normal operation. For example, in an embodiment in which a Zener diode is used as the trigger circuit 10, the Zener diode does not break down at the time of normal operation. Moreover, the resistance R1 is connected between the base and the emitter of the bipolar transistor Q1. Therefore, the bipolar transistor Q1 does not turn on at the time of normal operation.

Furthermore, Metal-Oxide-Semiconductor Field Effect Transistor (MOSFET) may be used instead of the bipolar transistors Q1 and Q2.

The integrated circuit according to the above-described embodiments can be used as a circuit for driving a high breakdown voltage and high output element such as Insulated Gate Bipolar Transistor (IGBT) and Power MOSFET.

Figure 2:
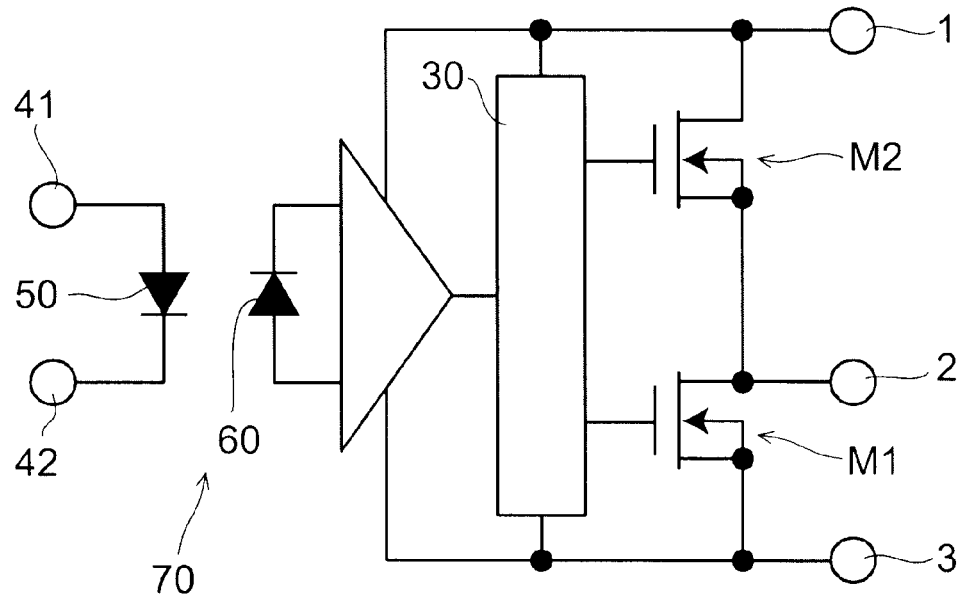
FIG. 2 is a circuit diagram of a circuit in which the integrated circuit according to the embodiments is combined with a photo-coupler.

FIG. 2 is a circuit diagram of a circuit in which the integrated circuit according to the embodiments is combined with a photo-coupler 70. In the integrated circuit shown in FIG. 2, among the above-described elements, only the internal circuit 30, the high side output transistor M2, the low side output transistor M1, the VCC terminal 1, the VO terminal 2, and the GND terminal 3 are shown.

The photo-coupler 70 has a light-emitting element 50 and a light receiving element 60. An anode of the light-emitting element 50 is connected to one input terminal 41, and a cathode of the light-emitting element 50 is connected to the other input terminal 42.

Electric signals input into the input terminals 41 and 42 are converted into light by the light-emitting element 50, and the light receiving element 60 is brought into conduction by the light, and the signals are transferred to the internal circuit 30.

Since the input terminals 41 and 42 and the VO terminal 2 which is an output terminal are electrically insulated, these terminals can be used for signal transfer while maintaining insulation between two-system circuits each driven by an independent power supply.

Figure 6:
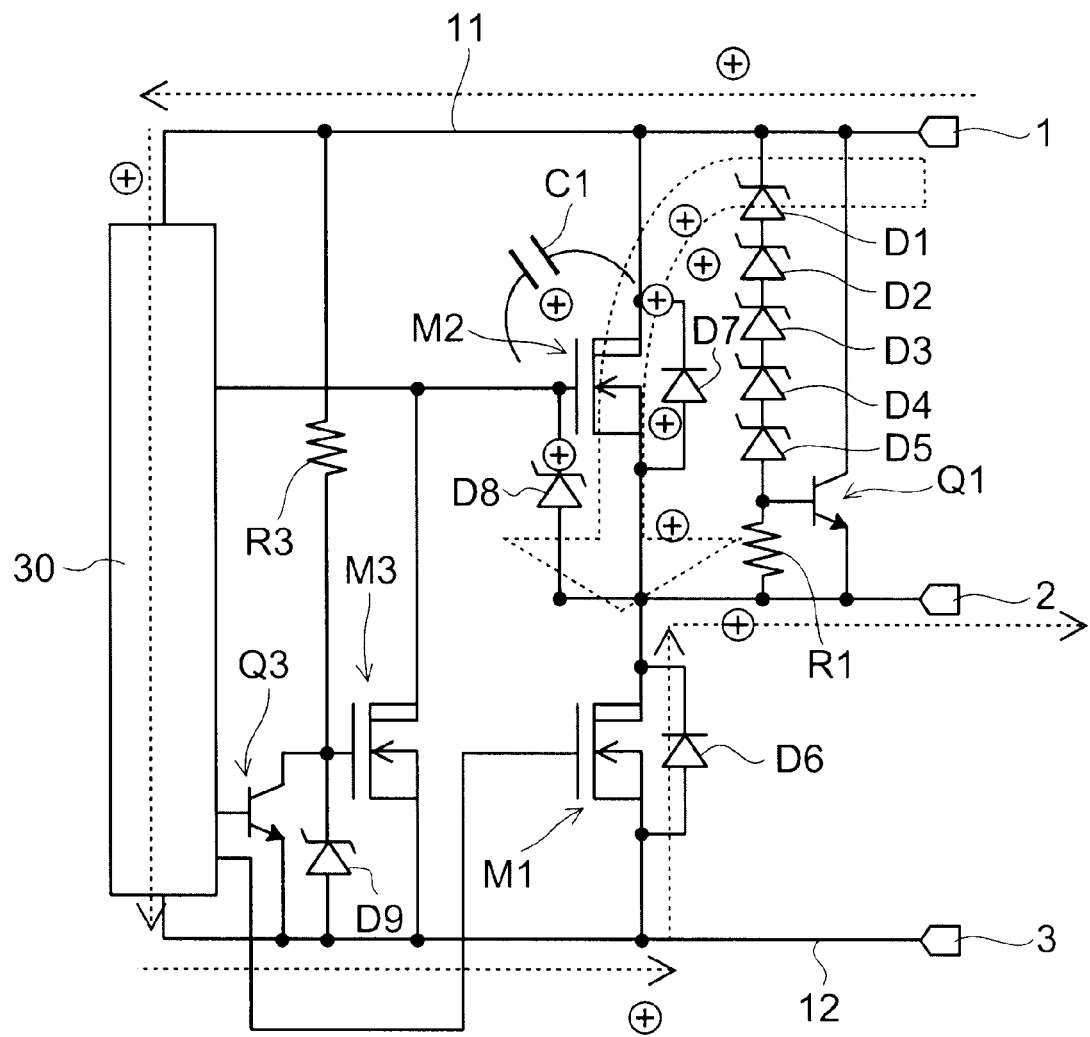
FIG. 6 shows a circuit diagram of an integrated circuit according to a comparative example.

Here, FIG. 6 shows a circuit diagram of an integrated circuit according to a comparative example. The same elements as the elements of the integrated circuit according to the above-described embodiments are designated by the same reference numerals.

In the circuit according to the comparative example, transistor M3 is connected between the gate of the high side output transistor M2 and the ground line 12. The transistor M3 is an n-type MOSFET. Resistance R3 is connected between the power-supply line 11 and the gate of the transistor M3.

A Zener diode D9 is connected between the gate of the transistor M3 and the ground line 12. The forward direction of the Zener diode D9 is set to a direction going from the ground line 12 toward the gate of the transistor M3.

Furthermore, an npn-type bipolar transistor Q3 is connected between the gate of the transistor M3 and the ground line 12. The base of the bipolar transistor Q3 is connected to the internal circuit 30.

A part of ESD charges applied to the VCC terminal 1 passes through the internal circuit 30 and reaches the ground line 12. Furthermore, a part of ESD charges reaches to the VO terminal 2 from the ground line 12 via the parasitic diode D6 of the low side output transistor M1. Therefore, electric potentials of the GND terminal 3 and the ground line 12 serves as Vbe determined by the parasitic diode D6.

Usually, the output transistor occupies most parts of chip areas, and thus parasitic capacitance C1 between a drain and a gate of the transistor is also large. Since the electric potential of the power-supply line 11 increases rapidly at the time of applying an ESD, the gate electric potential of the high side output transistor M2 increases via the parasitic capacitance C1. Since the VO terminal 2 is set to 0 V, the high side output transistor M2 turns on.

If the high side output transistor M2 turns on, most parts of EDS charges are consumed by the high side output transistor M2. In some cases, if the acceptable current value of the high side output transistor M2 is exceeded, the transistor M2 may be broken by heating.

The transistor M3 in the circuit according to the comparative example suppresses the gate electric potential of the high side output transistor M2. That is, at the time of applying an ESD, the gate electric potential of the transistor M3 is increased by the resistance R3, then, the transistor M3 turns on, and the increase of the gate electric potential of the high side output transistor M2 is suppressed.

However, as mentioned above, since the electric potential of the ground line 12 is Vbe, the gate electric potential of the high side output transistor M2 cannot be reduced to be smaller than Vbe. If the threshold voltage of the high side output transistor M2 is smaller than Vbe, the high side output transistor M2 may turn on eventually to be destroyed by EDS charges.

In contrast, according to the integrated circuit according to at least one of the above-described embodiments, at the time of applying an ESD, the bipolar transistor Q2 turns on and short-circuited between the gate and the source of the high side output transistor M2. By this, the high side output transistor M2 can be surely turned off at the time of applying an ESD. As a result, the high side output transistor M2 can be prevented from being broken.

Furthermore, at the time of normal operation, the bipolar transistor Q2 is in an off state. Therefore, at the time of normal operation, the high side output transistor M2 can be controlled to be on or off in accordance with signals of the internal circuit 30.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An integrated circuit comprising:
   a power supply terminal;
   an output terminal;
   a high side output transistor including a first electrode connected to the power supply terminal, a second electrode connected to the output terminal, and a control electrode;
   a transistor which is connected between the control electrode and the second electrode of the high side output transistor and which short-circuits the control electrode and the second electrode in an on state;
   a trigger circuit connected between the power supply terminal and the control electrode of the transistor; and
   an Electro Static Discharge (ESD) protection circuit connected between the power supply terminal and the output terminal,
   when a voltage larger than a maximum rating voltage is applied to the power supply terminal, the trigger circuit operating, the transistor turning on, the high side output transistor turning off, and the ESD protection circuit operating.

2. The circuit according to claim 1, wherein the ESD protection circuit operates at the same time when the high side output transistor turns off.

3. The circuit according to claim 1, wherein the ESD protection circuit operates after the high side output transistor turns off.

4. The circuit according to claim 1, wherein the transistor is a bipolar transistor having a base as the control electrode.

5. The circuit according to claim 1, further comprising a resistance connected between the control electrode of the transistor and the output terminal.

6. The circuit according to claim 1, wherein the trigger circuit includes a Zener diode having a direction going from the control electrode of the transistor toward the power supply terminal as a forward direction.

7. The circuit according to claim 6, wherein the trigger circuit further includes a second resistance connected between the Zener diode and the control electrode of the transistor.

8. The circuit according to claim 6, wherein the ESD protection circuit includes a second transistor connected between the power supply terminal and the output terminal, and a second Zener diode connected between the Zener diode and a control electrode of the second transistor.

9. The circuit according to claim 8, wherein when a voltage larger than the maximum rating voltage is applied to the power supply terminal, the second Zener diode supplies current to the control electrode of the second transistor, and turns on the second transistor.

10. The circuit according to claim 8, wherein the second transistor is a bipolar transistor having a base as the control electrode.

11. The circuit according to claim 8, wherein when a voltage larger than the maximum rating voltage is applied to the supply power terminal, the transistor turns on before the second transistor turns on.

12. The circuit according to claim 1, wherein the trigger circuit and the ESD protection circuit include a common Zener diode.

13. The circuit according to claim 1, wherein at the time of normal operation in which a voltage applied to the power supply terminal is not more than the maximum rating voltage, the trigger circuit does not operate and the transistor is in an off state.

14. The circuit according to claim 13, further comprising an internal circuit connected to the control electrode of the high side output transistor, wherein at the time of the normal operation, the high side output transistor is controlled in accordance with signals of the internal circuit.

15. The circuit according to claim 1, further comprising:
   a ground terminal; and
   a low side output transistor connected between the output terminal and the ground terminal and connected in series to the high side output transistor.

16. The circuit according to claim 1, wherein the high side output transistor, the transistor, the trigger circuit, and the ESD protection circuit are integrated into the same semiconductor substrate.

* * * * *